United States Patent
Ku et al.

(10) Patent No.: US 8,607,116 B2
(45) Date of Patent: Dec. 10, 2013

(54) READDRESSING DECODER FOR QUASI-CYCLIC LOW-DENSITY PARITY-CHECK AND METHOD THEREOF

(75) Inventors: Yu-Hsien Ku, Hsinchu County (TW); Tung-sheng Lin, Hsinchu County (TW); Tai-Lai Tung, Hsinchu County (TW)

(73) Assignee: MStar Semiconductor, Inc., Hsinchu County (TW)

( * ) Notice: Subject to any disclaimer, the term of this patent is extended or adjusted under 35 U.S.C. 154(b) by 217 days.

(21) Appl. No.: 13/208,814

(22) Filed: Aug. 12, 2011

(65) Prior Publication Data

US 2012/0254685 A1    Oct. 4, 2012

(30) Foreign Application Priority Data

Mar. 29, 2011    (TW) .............................. 100110856 A

(51) Int. Cl.
  *H03M 13/00* (2006.01)
(52) U.S. Cl.
  USPC .......................................... 714/752; 714/786
(58) Field of Classification Search
  USPC .................................. 714/752, 786
  See application file for complete search history.

(56) References Cited

U.S. PATENT DOCUMENTS

| | | | | |
|---|---|---|---|---|
| 7,222,289 | B2 * | 5/2007 | Hung | 714/807 |
| 7,729,437 | B2 * | 6/2010 | Jeong et al. | 375/267 |
| 7,853,862 | B2 * | 12/2010 | Lakkis | 714/800 |
| 8,028,224 | B2 * | 9/2011 | Eroz et al. | 714/801 |
| 8,156,400 | B1 * | 4/2012 | Yeo et al. | 714/758 |
| 8,225,168 | B2 * | 7/2012 | Yu et al. | 714/752 |
| 8,271,851 | B2 * | 9/2012 | Dore et al. | 714/758 |

FOREIGN PATENT DOCUMENTS

CN    1822509    8/2006

* cited by examiner

*Primary Examiner* — Esaw Abraham
(74) *Attorney, Agent, or Firm* — WPAT, PC; Justin King

(57) ABSTRACT

A readdressing decoder for QC-LDPC decoding including a memory, a controller and parallel processors is provided. The memory stores a QC-LDPC matrix including sub-matrices respectively addressed with a corresponding address. The controller readdresses each of the sub-matrices into divided matrices and defines each of the divided matrices into a first address group and a second address group. The controller further respectively transmits the divided matrices of the first address group and the second address group to the parallel processors to perform correction algorithm.

20 Claims, 7 Drawing Sheets

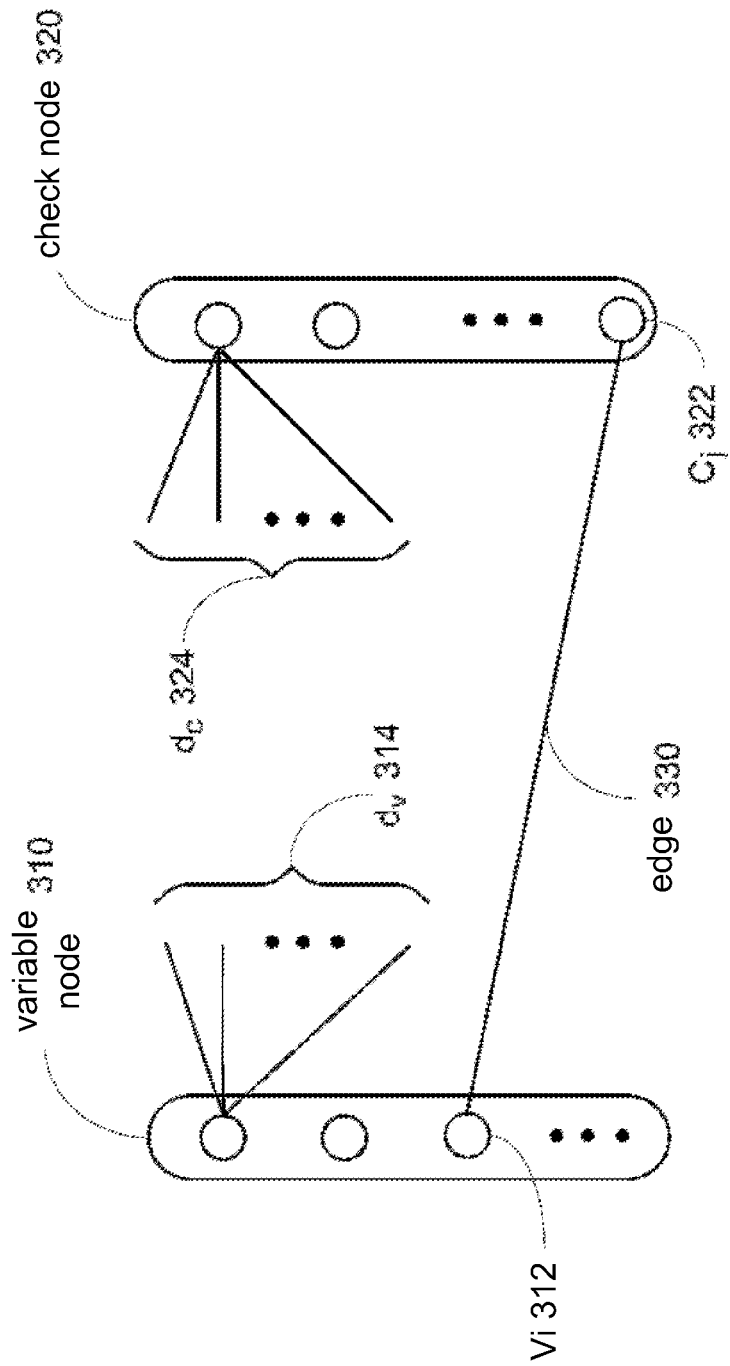
FIG. 1.A

__US 8,607,116 B2__

READDRESSING DECODER FOR QUASI-CYCLIC LOW-DENSITY PARITY-CHECK AND METHOD THEREOF

This application claims the benefit of Taiwan application Serial No. 100110856, filed Mar. 29, 2011, the subject matter of which is incorporated herein by reference.

BACKGROUND OF THE INVENTION

1. Field of the Invention

The invention relates in general to a decoder and associated decoding method for quasi-cyclic low-density parity-check (QC-LDPC) codes, and more particularly to a decoder comprising a parallel processing structure for QC-LDPC codes and associated decoding method.

2. Description of the Related Art

Along with rapid development of wireless transmission and communication technology, requirements for transmission bandwidth and efficiency also become stricter. The forward error correction is targeted at increasing transmission correctness and contributes noticeable improvement in increasing transmission efficiency, and is thus valued by developers. Under such trends, various methods and codes for forward error correction are proposed. Some of the well-known codes are the block code, the Hamming code, the convolutional code, the turbo code, and the low-density parity-check (LDPC) code that have attracted much attention in the last decade. In forward error correction applications, since the LDPC code approximates code performance of the Shannon limit, it is therefore an important branch for consideration.

The Shannon limit (or Shannon capacity) is defined as a coding rate in a communication channel which has a predetermined signal-to-noise ratio (SNR). In other words, the Shannon limit signifies a limitation (theoretical maximum) of the transmission capability (transfer rate) for a given communication channel at a particular noise level.

The LDPC code is a type of linear block error correcting code, where low-density indicates a ratio of the number of 1 in a check matrix relative to overall matrix elements is quite small, which is also the primary characteristic of low-density correction. The linear block code is a commonly implemented error correction code. According to the linear block code, a signal to be transmitted is multiplied with a generate matrix G to generate a transmission code longer than the original data. Upon receiving the signal, the signal is multiplied with a transposed check matrix H to check and correct the received data to restore the received signal information to the original data.

In an (n, k) LDPC code, n represents a codeword of the code, k represents a length of information bits, and the coding ratio of the LDPC code is defined as R=k/n by applying a defined check matrix. The check matrix is designated as regular, semi-regular, or irregular according to whether each column weight or row weight of the check matrix is the same. The column weight is based on the number of ones ("1") in one column of the check matirx, and the row weight is based on the number of ones ("1") in one row of the check matrix. A check matrix with a constant column weight and a constant row weight is defined as a regular check matrix; a check matrix with either a constant column weight or a constant row weight is defined as a semi-regular check matrix; a check matrix with no constant column weight or row weight is defined as an irregular check matrix. In terms of efficiency, performance of an irregular check matrix is the best, although associated hardware designs may suffer from complications due to its irregularity characteristic.

In currently promoted and specified terrestrial digital broadcast standards, e.g., China Mobile Multimedia Broadcasting (CMMB), Digital Terrestrial Multimedia Broadcast (DTMB), and Digital Video Broadcasting (DVB), including WiMax, IEEE802.11n, and IEEE802.3an, the LDPC code is promoted as a basis for forward error correction.

The LDPC code applied to the foregoing terrestrial digital broadcast is quasi-cyclic, and is so called a QC-LDPC code. A QC-LDPC code is defined by designating its corresponding parity-check matrices, and comprises a plurality of same-sized scattered cyclic matrices.

The QC-LDPC code is codeword-cyclic. More specifically, supposing the codeword $C=(c0, c1, \ldots, cN-1)$ is a qualified codeword (where N represents a length of the codeword), a codeword obtained by shifting $S(0 \leq s \leq N-1)$ elements to the right from the codeword C is still a qualified codeword. Quasi-cyclic is different from codeword-cyclic, which is merely partially cyclic. In other words, the QC-LDPC code is quasi-cyclic, with details to be described below.

Supposing the codeword $c=(c1, c2, \ldots, cn)$ is a qualified codeword of the QC-LDPC code, where a codeword N is nL, and a length of a vector $cj=(cj, 0, cj, 1, \ldots, cj, L-1)(1 \leq j \leq n)$ is L, a codeword Tpc obtained from shifting a codeword c by $p(0 \leq p \leq L-1)$ elements along a right loop is still a qualified QC-LDPC codeword. The quasi-cyclic codeword $Tpc=(\sim Tpc1, \sim Tpc2, \ldots, \sim Tpcn)$, means each vector cj is cyclically shifted to the right, that is, $\sim Tpc=(cj, L-p, cj, L-p+1, \ldots, cj, L-p-1)$.

Common LCPC decoding approaches perform algorithms using the natural logarithms base (logarithms with a base of e). Through logarithmic algorithms, multiplication operations are converted to addition and division operations are converted to subtraction, and indices are completely eliminated to leave performance of a decoder unaffected. However, complicated mathematical calculations are still required for logarithm algorithms in LDPC, for example:

$$\ln(e^a+e^b+e^c+\ldots)$$

To reduce burden on the above indices and algorithms, a Jacobian formula is applied to simplify the calculations, as:

$$\max{}^*(a,b)=\ln(e^a+e^b)=\max(a,b)+\ln(1+e^{-|a-b|})$$

The Jacobian calculation is commonly referred to as the max* algorithm. For calculations involving a longer sum of indices, the Jacobian algorithm replaces calculations of sum of indices by addition, thereby significantly lowering complications in decoding.

In error detection realized by the QC-LDPC code, according to the terrestrial broadcasting specifications, a signal to be transmitted by a transmitting terminal is multiplied by a generate matrix to generate a transmission code longer than the original data. Upon receiving the signal at a receiving terminal, the transmitted code is multiplied with a transposed check matrix to check and correct the received data to restore the original data. Below is an example taking an original data of 4 bits, and transmission data of 7 bits.

At the transmitting terminal, the original data is multiplied by the generate matrix, as represented by an equation (1) below:

$$[d_1 \ d_2 \ d_3 \ d_4] \times \begin{bmatrix} 1 & 0 & 0 & 0 & 1 & 1 & 0 \\ 0 & 1 & 0 & 0 & 1 & 0 & 1 \\ 0 & 0 & 1 & 0 & 0 & 1 & 1 \\ 0 & 0 & 0 & 1 & 1 & 1 & 1 \end{bmatrix} = [e_1 \ e_2 \ e_3 \ e_4 \ e_5 \ e_6 \ e_7] \quad (1)$$

At the receiving terminal, the check matrix is defined as a transposed matrix of the generate matrix, and the original data is restored by decoding at the receiving terminal based on the characteristic that a product of the generate matrix and its transposed matrix is 0, as represented by an equation (2) below:

$$[e'_1 \ e'_2 \ e'_3 \ e'_4 \ e'_5 \ e'_6 \ e'_7] \times \begin{bmatrix} 1 & 1 & 0 \\ 1 & 0 & 1 \\ 0 & 1 & 1 \\ 1 & 1 & 1 \\ 1 & 0 & 0 \\ 0 & 1 & 0 \\ 0 & 0 & 1 \end{bmatrix} = \begin{cases} e'_1 + e'_2 + e'_4 + e'_5 = 0 \\ e'_1 + e'_3 + e'_4 + e'_6 = 0 \\ e'_2 + e'_3 + e'_4 + e'_7 = 0 \end{cases} \quad (2)$$

Supposing no errors exist during the transmission process, a result of the equation (2) at the receiving terminal would render a zero vector. However, in the event that a non-zero vector is produced, it means that data received by the receiving end contains an error, and so the error is identified by check matrix algorithms and then corrected to achieve error correction.

Under a dilemma between decoding performance and hardware complexity, LDPC coding is generally realized by a partially parallel structure, in which a memory is utilized for storing exchanged information. The size of the memory is directly proportional to the number of binary ones ("1") in a parity-check matrix (PCM). Since the memory needed for realizing LDPC decoding would occupy a considerably large area on an integrated circuit, it is then a vital task to reduce the area occupied by the memory in an LDPC decoder.

Taking the digital terrestrial broadcast applying QC-LDPC correction for decoding as example, a decoding structure of the prior art needs to concurrently process large amounts of data. For the DVB-T2 specifications, it is essential that a system should be capable of concurrently storing and performing high-speed algorithms over a 64800-bit matrix in order to decode information of one frame when the coding rate is 3/4. Therefore, apparently, even with parallel operations, huge amounts of system resources with high-speed processing ability are still required for processing the data amounts of the above matrix to satisfy a minimum update rate for dynamic display, meaning that costs need for realizing the DVB specifications are significantly increased.

Therefore, the present invention provides a decoder and associated decoding method for decoding QC-LDPC codes to overcome the above drawbacks associated with the prior art.

SUMMARY OF THE INVENTION

The invention is directed to a decoder and decoding method for QC-LDPC code to overcome a drawback of increased cost caused by large operational resources consumed by high-speed calculations of QC-LPDC codes.

According to an aspect the present invention, a decoder for decoding QC-LPDC codes is provided. The decoder comprises: a memory, for storing a QC-LPDC matrix each comprising a plurality of sub-matrices respectively addressed with a corresponding address; a controller, for respectively readdressing the sub-matrices into a plurality of divided matrices, and respectively defining the divided matrices into a first address group and a second address group; and a plurality of parallel processors. The controller further respectively transmits the divided matrices corresponding to the first address group and the second address group to the parallel processors to perform correction algorithm to generate a first correction result and a second correction result. Additionally, a ratio between the number of divided matrices of the first address group or the number of divided matrices of the second address group and the number of parallel processors is an integer.

According to another aspect of the present invention, a readdressing decoding method for decoding QC-LPDC codes is provided. The method comprises steps of: readdressing sub-matrices of a QC-LDPC matrix into a plurality of divided matrices according to a divided matrix number, and defining the divided matrices into a first address group and a second address group; and performing correction algorithms on the divided matrices of the first address group and the divided matrices of the second address group.

Therefore, the present invention provides an advantageous readdressing decoder, which processes divided matrices divided from sub-matrices of a check matrix and then restores the divided matrices to the sub-matrices according to readdressing indices. According to the number n of the divided matrices, the number of parallel processors in the corrector is lowered to 1/n to significantly reduce hardware costs of high-speed decoding.

The above and other aspects of the invention will become better understood with regard to the following detailed description of the preferred but non-limiting embodiment(s). The following description is made with reference to the accompanying drawings.

BRIEF DESCRIPTION OF THE DRAWINGS

FIG. 1a is a schematic diagram of an LDPC bipartite graph.

DETAILED DESCRIPTION OF THE INVENTION

In the specification and following claim scope, certain terms are utilized to represent particular elements. It is to be appreciated to those skilled in the related art that different terms referring to the same element may be used by different hardware manufacturers. Therefore, in the specification and following claim scope, distinctions between elements are not implied by differences in terms but are rather distinguished by functional differences. The term "comprise" throughout the specification and following claim scope is open-end construed as "including but not limited to". Further, "electrically coupled" covers all direct and indirect electric connection means. As a result, if it is stated that a first device is electrically coupled to a second device, it means that the first device is directly electrically coupled to the second device, or is electrically coupled to the second device via other devices or connection means.

Figure 1:
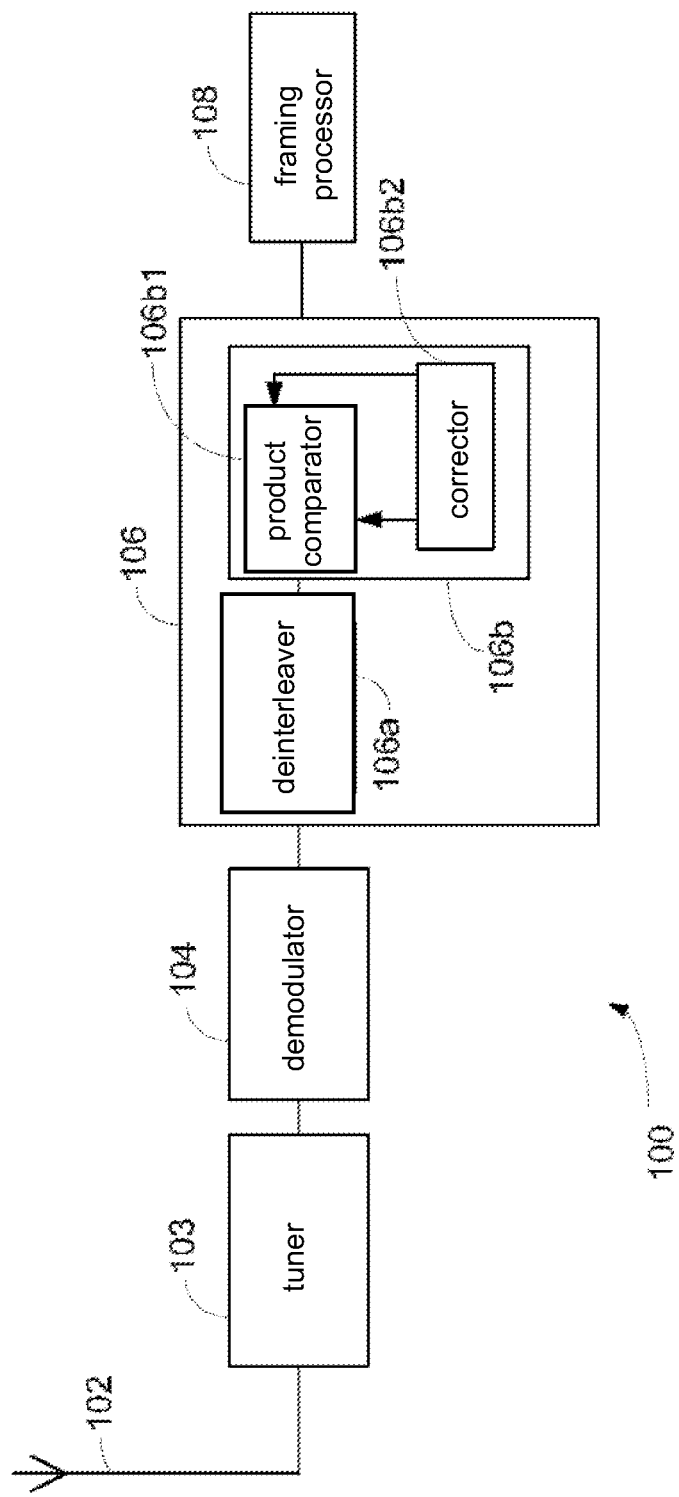
FIG. 1 is a schematic diagram of a terrestrial broadcast system receiving end 100 according to an embodiment of the present invention.

FIG. 1 shows a schematic diagram of a terrestrial broadcast system receiving system 100 according to an embodiment of the present invention. The terrestrial broadcast system 100 comprises an antenna 102, a tuner 103, a demodulator 104, a forward error correction (FEC) decoder 106, and a framing processor 108. The FEC decoder 106 comprises a deinterleaver 106a and an LDPC decoder 106b. The LDPC decoder 106b comprises a product comparator 106b1 and a corrector 106b2. The antenna 102 is electrically coupled to the tuner 103, the tuner 103 is electrically coupled to the deinterleaver 104, the demodulator 104 is electrically coupled to the FEC decoder 106, and the FEC decoder 106 is electrically coupled to the framing processor 108. The deinterleaver 106a is respectively electrically coupled to the demodulator 104 and the product comparator 106b1. The product comparator 106b1 further electrically coupled to the corrector 106b2. The LDPC decoder 106b is electrically coupled to the framing processor 108.

The antenna 102 receives a radio frequency (RF) terrestrial broadcast signal transmitted from a terrestrial broadcast system transmitting terminal. The received RF terrestrial broadcast signal is forwarded to the demodulator 104 for demodulation to generate a baseband terrestrial broadcast signal. The baseband terrestrial broadcast signal is outputted to the deinterleaver 106a. The deinterleaver 106a converts the baseband terrestrial broadcast signal to an information matrix of a QC-LDPC code, and transmits the information matrix to the product comparator 106b1. In one embodiment, the tuner 103 converts the RF terrestrial broadcast signal to intermediate frequency (IF), down-converts the RF terrestrial broadcast signal to baseband, demodulates the RF terrestrial broadcast signal, or performs digital conversion when the input signal is in an analog format. The deinterleaver 106a performs variable coding and modulation (VCM) and adaptive coding and modulation (ACM) operations. The product comparator 106b1 multiplies the information matrix and a check matrix (H matrix) to generate a first check value. When the check value equals 0, it means the information in the information matrix is correct (without error), and the LDPC decoder 106b retrieves frame data from the information matrix. The page data is transmitted to the framing processor 108. The framing processor 108 then displays the frame data on a display (not shown).

When the check value is greater than 0, the corrector 106b2 is activated to perform error correction. The check matrix is corrected by utilizing LDPC decoding algorithms, and the corrected matrix is sent back to the product comparator 106b1. The product comparator 106b1 multiplies the information matrix with the corrected check matrix to generate a second check value. When the second check value is non-zero, the corrector 106b2 again corrects the check matrix by utilizing LDPC decoding algorithms until the check value generated by the product comparator 106b1 is 0. For example, the corrector 106b2 realizes the correction by sum-product algorithm, log-domain sum-product algorithm, or min-sum algorithm. In this embodiment, the corrector 106b2 may be realized by software or hardware. For example, a corrector 106b2 realized by hardware may concurrently comprise a circuit of several types of algorithms for accommodating different algorithms of different terrestrial broadcast specifications and customer requirements. Alternatively, a corrector 106b2 realized by software may execute different functions based on different built-in software.

The terrestrial broadcast system receiving end 100 in FIG. 1 is applicable to a terrestrial broadcast system compliant to ITU-T J.83 defined by the Telecommunication Standardization Sector (ITU-T), for example, the DVB-T2 standard is included in ITU-T J.83. In DVB-T2, the LDPC coded information matrix is defined as a preframe. The preframe comprises two codeword formats of 64800 bits and 16200 bits in the DVT-T2 standard. In DVB-T2, a relationship between information bits K, a codeword length N, a generator matrix G, and a parity-check matrix H is represented as:

information bits: K
codeword length: N
parity-check bits: N−K=M
generator matrix G (K×N):

$$\begin{bmatrix} 1 & 0 & 0 & \cdots & 0 \\ 0 & 1 & 0 & \cdots & 0 \\ 0 & 0 & 1 & \cdots & 0 \\ \vdots & \vdots & \vdots & \ddots & \vdots \\ 0 & 0 & 0 & \cdots & 1 \end{bmatrix} \begin{bmatrix} p_{0,0} & p_{0,1} & \cdots & p_{0,M-1} \\ p_{1,0} & p_{1,1} & \cdots & p_{1,M-1} \\ p_{2,0} & p_{2,1} & \cdots & p_{2,M-1} \\ \vdots & \vdots & \ddots & \vdots \\ p_{K-1,0} & p_{K-1,1} & \cdots & p_{K,M-1} \end{bmatrix} = [I_{K \times K} \mid P_{K \times M}]$$

parity check matrix H (M×N):

$$\begin{bmatrix} p_{0,0} & p_{0,1} & \cdots & p_{0,M-1} \\ p_{1,0} & p_{1,1} & \cdots & p_{1,M-1} \\ p_{2,0} & p_{2,1} & \cdots & p_{2,M-1} \\ \vdots & \vdots & \ddots & \vdots \\ p_{K-1,0} & p_{K-1,1} & \cdots & p_{K,M-1} \end{bmatrix} \begin{bmatrix} 1 & 0 & 0 & \cdots & 0 \\ 0 & 1 & 0 & \cdots & 0 \\ 0 & 0 & 1 & \cdots & 0 \\ \vdots & \vdots & \vdots & \ddots & \vdots \\ 0 & 0 & 0 & \cdots & 1 \end{bmatrix} = [P^T_{M \times K} \mid P_{M \times M}]$$

A relationship between a coding rate and parameters associated with the above is represented as in Table-1 below, where Q represents the number of sub-matrices that need to be processed in parallel in a system with an x-bit data processing capability in each parallel processing unit:

TABLE 1

| Coding rate | K | N | Q = (N − K)/X |
|---|---|---|---|
| ½ | 32400 | 64800 | 90 |
| ⅗ | 38880 | 64800 | 72 |
| ⅔ | 43200 | 64800 | 60 |
| ¾ | 48600 | 64800 | 45 |
| ⅘ | 51840 | 64800 | 36 |
| ⅚ | 54000 | 64800 | 30 |

For illustration purposes, the DVB-T2 standard is to be used in the embodiment below. It is to be noted, that, although definitions of the DVB-T2 standard are used, the associated description is not to be construed as limiting the scope of the present invention.

Some publications are referred for theories of applications of the LDPC code in the DVB-T2 standard. For example "Hau Thien Tran, "Low-Density Parity-Check Decoder and Associated Decoding Method", publication number CN1822509, publication date Aug. 23, 2006", relates to this subject matter.

An LDPC code structure is illustrated by a bipartite graph (or a Tanner diagram). FIG. 1.a shows a schematic diagram of an LDPC code. Check nodes are at the upper part and bit nodes are at the lower part of the bipartite graph. Each bit node corresponds to a column of a parity-check matrix, i.e., a bit of a codeword, and a check node corresponds to a row of a parity-check matrix, i.e., a parity-check equation. When a section length approaches infinity, each check node is connected to only very few bit nodes, and hence is classified as "low-density". H=(hij)M×N is defined as an LDPC matrix having a length N. The number of binary ones ("1") in a row i in a parity-check matrix is represented as dv(i), and the number of binary ones ("1") in a row j is represented as dc(j). In the bipartite diagram, the left nodes in the parity-check matrix are bit variables (or information nodes 310 in the decoded LDPC code signal), and the right nodes are check formulae (or check nodes 320). The bipartite diagram defined by H is defined according to N variable nodes and M check nodes. Each variable node in the N variable nodes 310 comprises a precise dv(i) edge (e.g., an edge 330) that links to an information node and one or a plurality of check nodes (or information nodes) 320. The edge 330 shown in the diagram links an information node vi312 and a check node cj322. The number of dv of the edge (as shown by dv314) is defined as a degree of the variable nodes i. Similarly, each check node of the M check nodes 320 comprises precise dc(j) edges linking the node to one or a plurality of variable nodes 310. The number dc of the nodes is defined as a degree of the check nodes j.

A log-likelihood ratio (LLR) of the LDPC code is determined mathematically as detailed below.

When the LDPC code C={v/v=(V0, ..., Vn−1), VHT=0}, and a received vector of a transmitted signal is y=(y0, ..., yn−1), a metrics of the channel is defined as p(yi/vi=0), p(yi/vi=1), where i=0, ..., N−1, then the LLR of the metrics is defined as:

$$L_{metrics}(i) = \ln \frac{p(y_i \mid v_i = 0)}{p(y_i \mid v_i = 1)}$$

In the above equation, "ln" is a natural logarithm with a base of e, and vi is the variable node. For each variable node vi, its LLR is defined as:

$$\ln \frac{p(v_i = 0 \mid y_i)}{p(v_i = 1 \mid y_i)} = L_{metric}(i) + \ln \frac{p(v_i = 0)}{p(v_i = 1)}$$

Therefore, extrinsic information of the check node Cj of the edges (i, j) is represented mathematically as:

$$L_{check}^{n}(i, j) = $$
$$(-1) \left[ \prod_{e \in E_c(j)\setminus\{(i,j)\}} sign(L_{var}^{n-1}(e)) \right] \max*(\{-\mid L_{var}^{n-1}(e) \mid \| e \in E_c(j)\setminus\{(i, j)\}\})$$

$$\min^* +(x, y) = \max^*(x, y) = \max(x, y) + \ln(1 + \exp(-\mid x - y \mid))$$
$$\min^* -(x, y) = \ln(\exp(x) - \exp(y)) = \max(x, y) + \ln(1 - \exp(-\mid x - y \mid))$$

Wherein, $L_{var}^{n-1}(e)$ is the extrinsic value of inner variable nodes. For check node Cj, where j=0, ..., M−1, the edge is defined as $E_c(i)=\{e_0, ..., e_{d_c-1}\}$, $e \in E_c(j)\setminus\{(i, j)\}$, which represents all edges from the check node Cj apart from edges emitted from the check node Cj to the variable node Vi.

By simplifying with the Jacobian formula below, a simplified equation of extrinsic information is obtained:

$$L_{check}^{n}(i, j) \approx \left[ \prod_{e \in E_c(j)\setminus\{(i,j)\}} sign(L_{var}^{n-1}(e)) \right] \min(\{\mid L_{var}^{n-1}(e) \mid \| e \in E_c(j)\setminus\{(i, j)\}\})$$

$$\min^*(x_1, \cdots, x_{N-1}) = \min^* - (\min^* + (x_1, \cdots, x_N), x_N)$$

Derived from the two equations above, the extrinsic information is obtained mathematically as:

$$L_{check}^{n}(i, j) = $$
$$(-1) \left[ \prod_{e \in (j)\setminus\{(i,j)\}} sign(L_{var}^{n-1}(e)) \right] \max^*(\{-\mid L_{var}^{n-1}(e) \mid \| e \in E_c(j)\setminus\{(i, j)\}\})$$

In conclusion, the extrinsic information of the variable nodes is represented by the equations below:

Compute $L_{check}^{n}(e, a) = $
$$\min^*(\alpha_{c(e),v(e)}(0) + \beta_{c(e),v(e)}(a), \alpha_{c(e),v(e)}(1) + \beta_{c(e),v(e)}(a+1))$$

Figure 2:
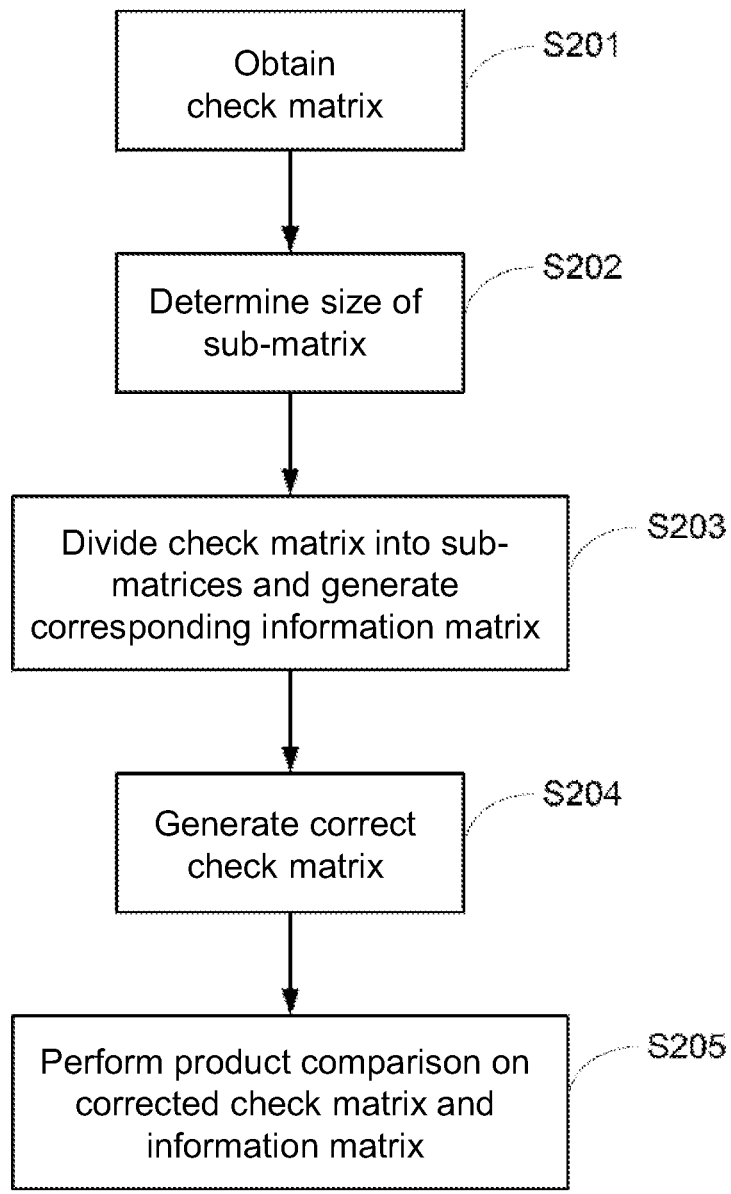
FIG. 2 is a flowchart of applying min-sum algorithms on a QC-LDPC check matrix according to an embodiment of the present invention.

Compute $L_{var}^{n}(e, a) = L_{metric}^{v(e)}(a) + \sum_{e' \in E_v(v(e))\setminus e} L_{check}^{n}(e', a)$ FIG. 2 shows a flowchart of implementing the corrector 106b2 by applying min-sum algorithms on a QC-LDPC check matrix according to an embodiment of the present invention. In Step S201, the corrector 106b2 obtains the check matrix in a non-zero product multiplied with the information matrix. In Step S202, the corrector 106b2 determines a unit size of sub-matrices to divide the check matrix in subsequent steps. For example, the size of the sub-matrices is determined according to terrestrial broadcast specifications, processing capabilities of hardware parallel processors or coordination of memory layout. The coordination of memory layout means memory sizes designated according to Silicon Intellectual Property (SIP) of different memories, and has layout characteristics that affect system performance efficiency due to different data amounts accessed per unit. In Step S203, according to the unit size, the information matrix is divided into a plurality of sub-matrices, and corresponding address information of the sub-matrices is generated. In Step S204, calculations are performed on the sub-matrices according to correction algorithms complying with predetermined terrestrial broadcast specifications or different customer requirements to generate a corrected check matrix. In this embodiment, the correction algorithm is realized by min-sum algorithms.

In Step S205, the corrector 106b2 transmits the correct check matrix to the product comparator 106b1. The correct check matrix then again performs product comparison with the data matrix by the product comparator 106b1.

In predetermined terrestrial specifications, specifications of the sub-matrices for correcting the check matrix are defined. For example, in DVB-T2, the sub-matrix is defined to 360 bits. However, for DVB-T2, 360 sub-matrices are needed to divide the check matrix. In other words, hardware for implementing the correction requires 360 parallel operators respectively stored in the sub-matrices.

Further, it is possible that the size of the sub-matrices is different from the size of the memory units designated in the memory layout such that the speed of accessing the sub-matrices is reduced. Under such circumstances, a mechanism for adjusting the divided matrices to appropriate sizes is needed to reduce the number of the parallel operators or to increase system performance through consistency with the memory layout.

Figure 3A:
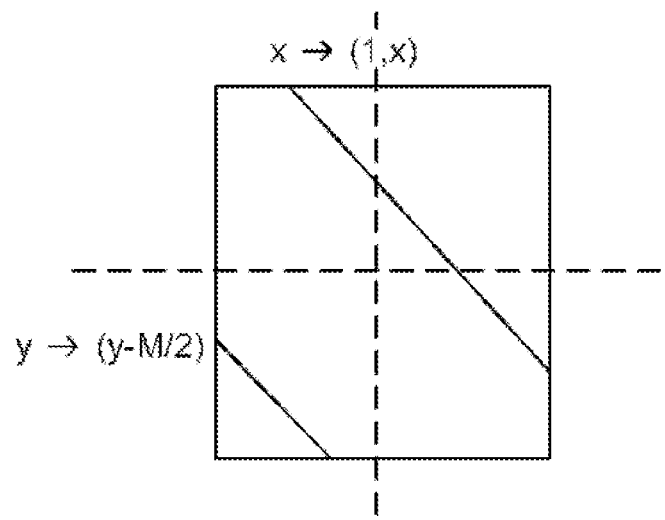
FIG. 3a is a schematic diagram of a readdressing method according to an embodiment of the present invention.
Figure 3B:
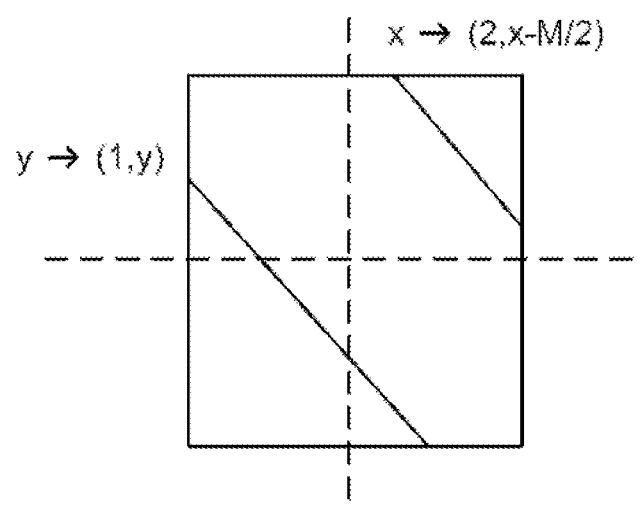
FIG. 3b is a schematic diagram of a readdressing method according to an embodiment of the present invention.

FIGS. 3a and 3b show schematic diagrams illustrating a readdressing method for a sub-matrix C according to an embodiment of the present invention. The sub-matrix C is a matrix of M×M bits. When the check matrix is a QC-LDPC, the sub-matrix C is a unit matrix or a rotation matrix. Based on the characteristic that a value of a unit matrix only exists at a main diagonal, apart from exceptional situations, any random point at a coordinate axis only has one corresponding value, and the same applies to the rotation matrix. In the sub-matrix C, a matrix value start point exists respectively at an X axis and a Y axis only, and is respectively represented as (x, 0) as an index x and (0, y) as an index y.

According to the method, the sub-matrix C is divided into an integer multiple n, and a length M/n of one divided matrix is calculated, followed by comparing the two indices with the divided matrix length M/n. When the index x is M/n<x<2M/n, the value x is addressed to a second divided matrix, and is reset its value to x−(M/n). When the index x is 2M/n<x<3M/n, the value x is addressed to a third divided matrix, and is reset its value to x−(2M/n). A readdressed x' of the index is represented as x'=x−N*(M/n), where N is an integer. Similarly, when M/n<y<2M/n, the value y is addressed to the second divided matrix, and is reset its value to y−(M/n). When the index y is 2M/n<y<3M/n, the index y is addressed to the third divided matrix, and is reset its value to y−(2M/n). A readdressed y' is represented as y'=x−N*(M/n), where N is an integer. In this embodiment, the sub-matrix is further divided into two matrices. However, as described previously, the sub-matrix C can be divided into N divided matrices. In a DVB-T2 embodiment, in a corresponding standard structure is a barrel shifter, which generates the QC-LDPC matrix by performing row exchange on the baseband terrestrial broadcast signal, and hence the readdressing method may be realized by the barrel shifter.

Figure 3C:
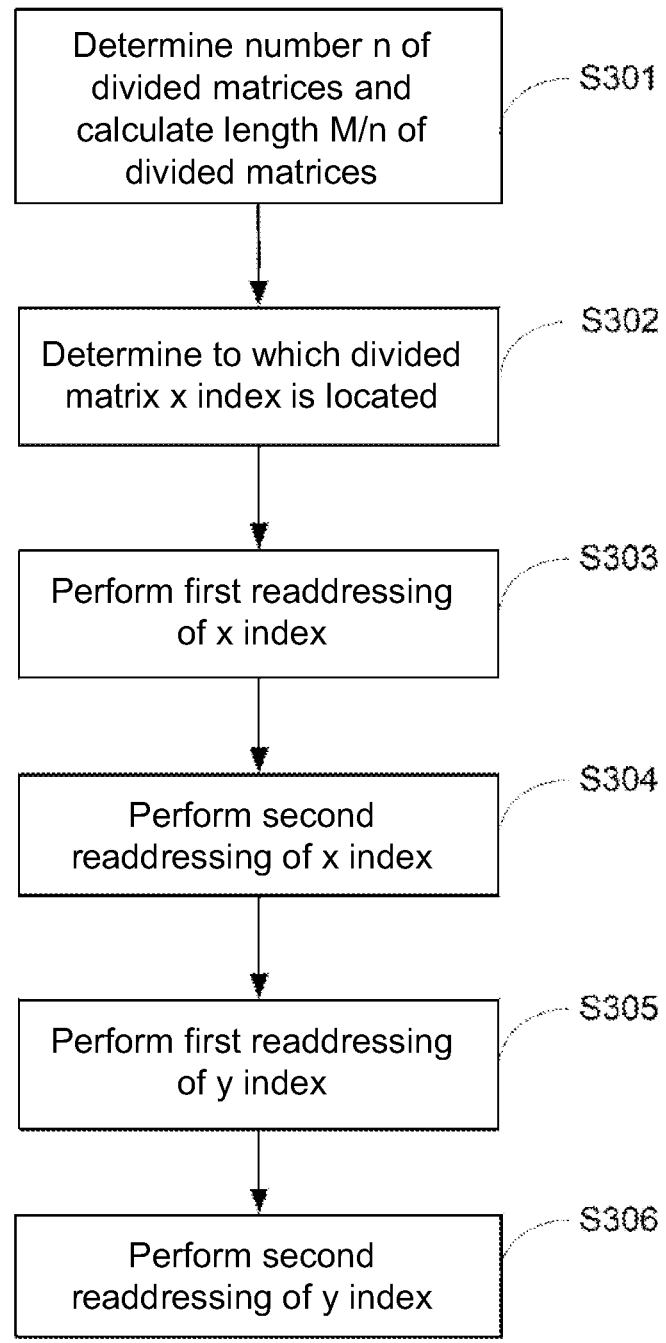
FIG. 3c is a flowchart of a readdressing method.

FIG. 3c shows a flowchart of a readdressing method for the sub-matrix C. In Step S301, a number n of the divided matrix from the sub-matrix C and a length M/n of a divided matrix are calculated. In Step S302, the index x is compared with the divided matrix length M/n to generate a ratio between the two. In Step S303, a first readdressing step is performed to determine which divided matrix the index x is readdressed in. In Step S304, a second readdressing step is performed, and the readdressed x' is mathematically expressed as x'=x−N*(M/n). In Step S305, the index y is readdressed to determine which divided matrix the index y is readdressed in. In Step S306, a second readdress step is performed, and the readdressed index y' is mathematically expressed as y'=y−N*(M/n). For example, the sub-matrices of the check matrix are divided and the processed divided matrices according to the readdress indices are restored to the sub-matrix using a corrector. Therefore, the number n of the divided matrices is lowered to correspondingly reduce the number of parallel processors in the corrector to 1/n of the original amount, thereby significantly reducing hardware cost for QC-LDPC decoding.

Figure 4:
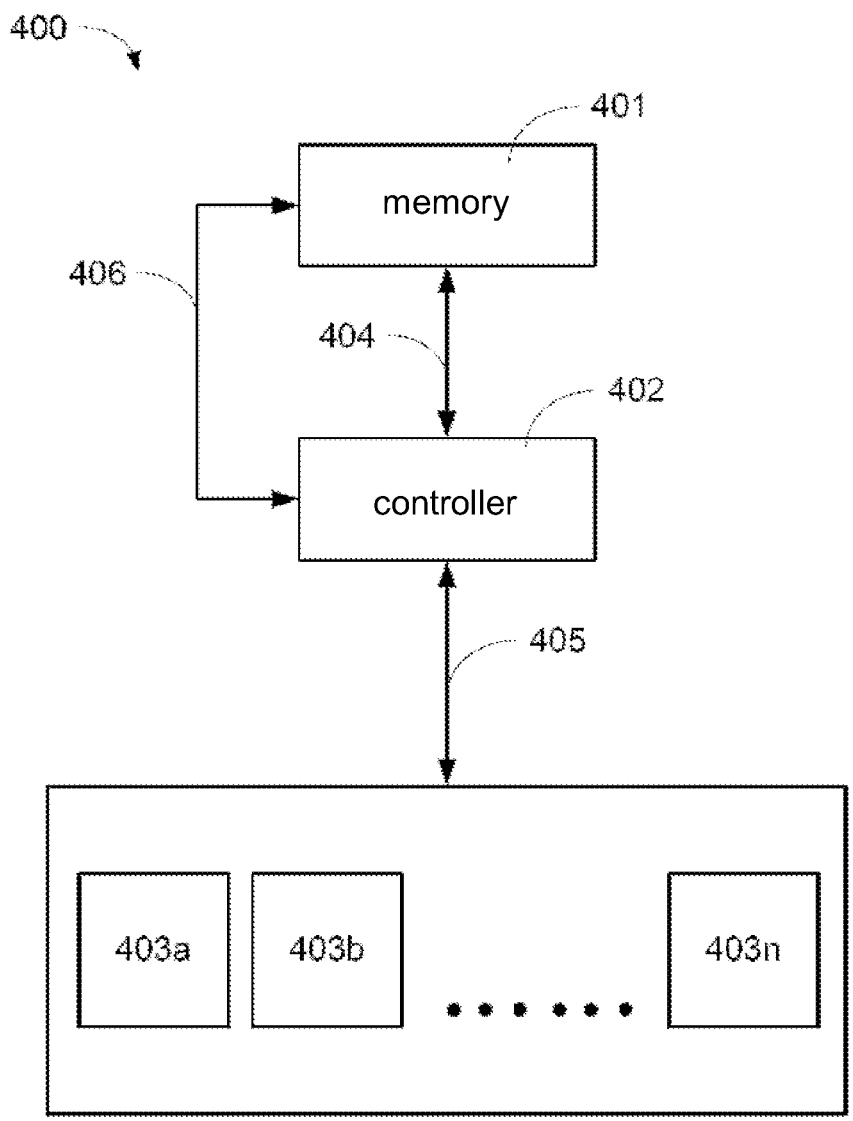
FIG. 4 is a schematic diagram of a readdressing corrector according to an embodiment of the present invention.

FIG. 4 shows a schematic diagram of a readdressing corrector 400 according to an embodiment of the present invention. The corrector 400 comprises a memory 401, a controller 402, and a plurality of parallel processors 403a to 403n. The controller 402 comprises a first information channel 404, a second information channel 405, and an addressing channel 406. The controller 402 is electrically coupled to the memory 401 via the first information channel 404 and the addressing channel 406, and is electrically coupled to the parallel processors 403a to 403n via the second information channel 405, respectively. During the correction process, a check matrix is stored in the memory 401. Taking the DVB-T2 for example, the check matrix is stored in the memory 401 according to a size of sub-matrices defined by the DVB-T2 specification and address formats corresponding to the sub-matrices. Therefore, the sub-matrices, each comprising an individual axis index, are stored in the memory 401. In a planar coordinate system, each sub-matrix comprises an x-axis index and a y-axis index, which respectively correspond to a start point of an x axis and a y axis in each sub-matrix. During a correction process, firstly, the controller 402 determines the number of divided matrices from a sub-matrix by comparing the total number of the sub-matrices with that of the parallel processors. For example, when the ratio between the total numbers of the sub-matrices and the parallel processors is 2 to 1, it means one sub-matrix would be divided into two divided matrices; when the ratio between the numbers of the sub-matrices and the parallel processors is 3 to 1, it means that one sub-matrix would be divided into three divided matrices, etc. When the dividing ratio is determined, the controller 402 reads the x-axis indices and the y-axis indices of the sub-matrices according to the addresses corresponding to the sub-matrices through the addressing channel. By implementing the readdressing method as disclosed with reference to FIG. 3, the sub-matrices are readdressed according to the x-axis indices and the y-axis indices. Thereafter, the sub-matrices are divided into a plurality of divided matrices according to above readdressing result.

In this embodiment, the example where each of the sub-matrices is divided into two divided matrices, a readdressed address corresponding to a first divided matrix from the two divided matrices is defined as an odd address. Readdressed addresses of each of the first divided matrices in the group of each of the sub-matrices are defined as an odd address group. Similarly, a readdressed address corresponding to a second divided matrix from the two divided matrices is defined as an even address. Readdressed addresses of each of the second divided matrices in the group of each of the sub-matrices are defined as an even address group. The first divided matrices corresponding to the odd address group are respectively inputted to the parallel processors 403a to 403n in parallel so as to conduct correction algorithms. When the first divided matrices are processed, the controller 402 respectively inputs the second divided matrices corresponding to the odd address group to the parallel processors 403a to 403n in parallel so as to conduct correction algorithms. When both the first and second divided matrices are processed, the controller 402 altogether processes values obtained from the correction algorithms performed on the first and second divided matrices to complete the whole correction process. The first and second sub-matrices respectively filled back to the memory are then combined to correspondingly form the corrected sub-matrices in the memory 401. More specifically, when the readdressing corrector 400 completes the correction algorithms on the first and second divided matrices, corresponding addresses of the sub-matrices in the memory 401 may be utilized to access the corrected sub-matrices.

In this embodiment, the correction algorithms performed by the controller 402 are implemented by min-sum algorithms, which are performed based on obtaining minimum values of the x-axis and y-axis of the sub-matrices. In other words, in the example of performing the correction algorithms with min-sum algorithms, the controller 402 reads the first divided matrix and the second divided matrix respectively corresponding to the sub-matrices to obtain minimum values of the x-axis and the y-axis of the first divided matrix corresponding to one sub-matrix and minimum values of the x-axis and the y-axis of the second divided matrix corresponding to the same sub-matrix. The controller 402 then again compares the minimum values of the first divided matrix and the second divided matrix to obtain the minimum values of the x-axis and the y-axis of the first divided matrix and the second divided matrix to complete the combined processing procedure.

With respect to the parallel processing of the first divided matrices and the second divided matrices, in one embodiment, the parallel processing is concurrently processing the first divided matrices and the second divided matrices under the same operating clock to synchronically process the first divided matrices and the second divided matrices. However, under tolerable errors, a predetermined time difference may exist between processing of the first divided matrices and the second divided matrices. Alternatively, in one embodiment, the first divided matrices may be again divided into a plurality of matrix groups that are then respectively sent to the parallel processors 403a to 403n to process for further reducing hardware resources needed for realizing QC-LDPC parallel decoding.

Figure 5:
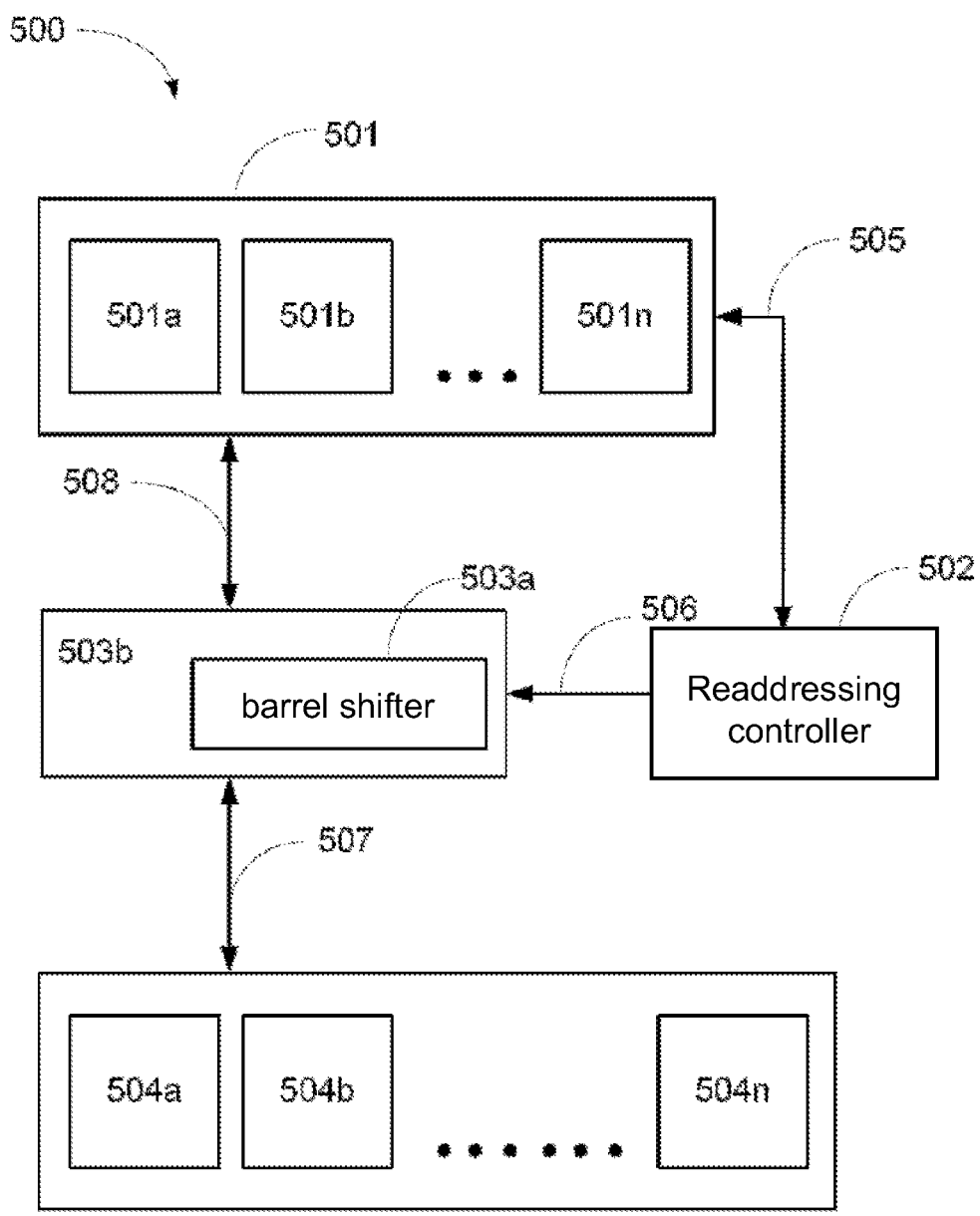
FIG. 5 is a schematic diagram of a readdressing corrector according to another embodiment of the present invention.

FIG. 5 shows a schematic diagram of a readdressing decoder 500 according to another embodiment of the present invention. The decoder 500 comprises a memory 501, a readdressing controller 502, a barrel shifter 503a, an interconnection network controller 503b, and a plurality of parallel processors 504a to 504n. The memory 501 comprises a plurality of memory units 501a, and 501b to 501n. Sizes of the memory units 501a, and 501b to 501n are determined according to sizes of memory units designated by SIP of different memories. The readdressing controller 502 is electrically coupled to the memory 501 through a first addressing channel 505, and is electrically coupled to the interconnection network controller 503b through a second addressing channel 506. The barrel shifter 503a is electrically coupled to the memory 501 through a first information channel 508, and is electrically coupled to the parallel processors 504a and 504b to 504n respectively through a second information channel 508.

During the correction process, a check matrix is stored in the memory 501. Taking the DVB-T2 as an example, the check matrix is stored in the memory 501 according to a size of sub-matrices defined by the DVB-T2 and address formats corresponding to the sub-matrices. In this embodiment, the size of the memory units is the same as the size of the sub-matrices, and the sub-matrices are corresponding stored in the memory units. Therefore, during each working clock, at least one of the sub-matrices can be entirely accessed in or out one of the memory units. Each sub-matrix comprises an x-axis index and a y-axis index, which respectively correspond to a start point of an x axis and a y axis in each sub-matrix.

During a correction process, the controller 502 first determines the number of divided matrices should be divided from the sub-matrices by comparing the number of the sub-matrices with that of the number of parallel processors. When the dividing ratio is determined, the controller 502 reads the x-axis indices and the y-axis indices of the sub-matrices according to the addresses corresponding to the sub-matrices through the first addressing channel. By implementing the readdressing method as disclosed with reference to FIG. 3, the divided matrices of the sub-matrices are readdressed according to the x-axis indices and the y-axis indices corresponding to the sub-matrices to generate the readdressed addresses corresponding to the divided matrices that are defined as corresponding address groups. In this embodiment, the sub-matrices are correspondingly divided into a first address group and a second address group.

Next, the readdressing controller 502 transmits the first address group and the second address group to the interconnection network controller 503b. The interconnection network controller 503b transmits the first divided matrices corresponding to the first address group to the parallel processors 504a and 504b to 504n in parallel for correction processing to generate a first correction result, which is then stored in the barrel shifter 503a. When the first divided matrices are processed, the interconnection network controller 503b transmits the second divided matrices corresponding to the second address group to the parallel processors 504a and 504b to 504n in parallel for correction processing to generate a second correction result. In this embodiment, to implement QC-LDPC decoding under a DVB-T2 structure, the barrel shifter 503a converts the sub-matrices into unit matrices by shifting addresses according to the first correction result and the second correction result to complete the correction process. In this embodiment, the readdressing controller 502 performs the correction algorithms with min-sum algorithms.

In the description of the above embodiments, a step of determining the number of divided matrices divided from the sub-matrices before performing the correction process is disclosed, this step may be directly programmed in a hardware structure or pre-written to software settings (e.g., firmware) that controls hardware arrangement such as parameters of the aforementioned memory layout and the number of the parallel processors. As a result, the step of determining the number of the divided matrices may be eliminated when performing the correction process so as to reduce processing time and increasing system efficiency.

The above parallel processing procedure of the first divided matrices and the second divided matrices, in one embodiment, means concurrently processing the first divided matrices and the second divided matrices under a same operating clock. However, under tolerable errors, a predetermined time difference may exist between processing of the first divided matrices and the second divided matrices. Alternatively, the first divided matrices may be again divided into a plurality of matrix groups that are then respectively sent to the parallel processors 504a and 504b to 504n for processing to further reduce hardware resources needed for implementing QC-LDPC parallel decoding.

Moreover, in the description of the above embodiments, the x-axis indices and the y-axis indices are read at the same time to implement QC-LDPC decoding. It is to be noted that the parallel decoding in other embodiments can be realized by implementing the x-axis indices or the y-axis indices, solely. For example, in an embodiment applying the DVB-T2 specifications, under conditions that the number of the sub-matrices is 360 and the number of the parallel processors is 180 (the ratio between the number of the sub-matrices and the number of the parallel processors is an integer, 2), by merely implementing the y-axis indices, the parallel processing decoding can be realized while reducing algorithm amounts as well as further increasing system efficiency.

It is also to be appreciated by a person skilled in related art that, although the DVB-T2 is taken as an example in the above embodiments, embodiments of DVB-C2 and DVB-S2 applying the QC-LDPC code are also encompassed by the scope of the present invention.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A readdressing decoder for decoding a quasi-cyclic low-density parity-check (QC-LDPC) code, comprising:
    a memory that stores a QC-LDPC matrix comprising a plurality of sub-matrices each having a corresponding address;
    a controller that respectively readdresses the sub-matrices into a plurality of divided matrices, and defines the divided matrices into a first address group or a second address group; and
    a plurality of parallel processors, coupled to the controller, that performs a correction process on the divided matrices of the first address group and the divided matrices of the second address group to generate a first correction result and a second correction result;
    wherein, a ratio between a number of the divided matrices of the first address group or a number of the divided matrices of the second address group and a number of the parallel processors is an integer.

2. The readdressing decoder according to claim 1, wherein the controller determines at least one axis index of the sub-matrices to readdress the sub-matrices.

3. The readdressing decoder according to claim 2, wherein the first correction result and the second correction result respectively comprise an x-axis index and a y-axis index of a corresponding divided matrix.

4. The readdressing decoder according to claim 1, wherein a ratio between the sub-matrices and the divided matrices corresponding to the sub-matrices is a first ratio, a ratio between a number of the sub-matrices and a number of the parallel processors is a second ratio, and a ratio between the first ratio and the second ratio is an integer.

5. The readdressing decoder according to claim 1, wherein the parallel processors perform the correction process with min-sum algorithms by comparing minimum values of the first correction result and the second correction result.

6. The readdressing decoder according to claim 3, wherein the number of the sub-matrices is 360, the number of the parallel processors is 180, and the parallel processors perform the correction process according to the y-axis indices corresponding to the divided matrices.

7. The readdressing decoder according to claim 3, wherein the number of the sub-matrices is 360, the number of the parallel processors is 180, and the parallel processors perform the correction process according to the x-axis indices corresponding to the divided matrices.

8. The readdressing decoder according to claim 1, wherein the controller further comprises a readdressing controller and a barrel shifter, the readdressing controller generates the first correction result and the second correction result, and the barrel shifter converts the sub-matrices to unit matrices by address shifting according to the first correction result and the second correction result.

9. The readdressing decoder according to claim 1, wherein the memory comprises a plurality of memory units, and each of the sub-matrices is stored in one of the memory units respectively.

10. The readdressing decoder according to claim 1, wherein when the sub-matrices are respectively a M*M matrix and a ratio between a number of the divided matrices corresponding to the first address group and a number of the parallel processors is n, a length of the divided matrices is M/n, and the controller compares the axis index with the length of the divided matrices; when the axis index is smaller than M/n, the axis index is same as the corresponding addresses of the sub-matrices of the divided matrices, and the axis index is address to a first divided matrix; and when the axis index is greater than M/n and smaller than 2M/n, the axis index is addressed to a second divided matrix, and the x-axis index is reset as x-axis index minus M/n.

11. A readdressing method for decoding a QC-LDPC code, comprising:
    storing a QC-LDPC matrix in a memory, wherein said QC-LDPC matrix comprises a plurality of sub-matrices, each having a corresponding address;
    readdressing said plurality of sub-matrices into a plurality of divided matrices according to a divided matrix number, respectively, and defining the divided matrices to a first address group or a second address group with a controller; and
    performing a correction process, with a plurality of parallel processors, on the divided matrices associated with the first address group and the divided matrices associated with the second address group, to generate a first correction result and a second correction result;
    wherein, a ratio between a number of the divided matrices of the first address group or a number of the divided matrices of the second address group and a number of the parallel processors is an integer.

12. The method according to claim 11, wherein the step of respectively readdressing the sub-matrices into the plurality of divided matrices further comprises:
    determining at least one axis index of the sub-matrices, and readdressing the sub-matrices according to the axis indices.

13. The method according to claim 12, further comprising:
    generating a first correction result and a second correction result, the first correction result and the second correction result respectively comprising an x-axis index and a y-axis index of the divided matrices respectively.

14. The method according to claim 11, wherein a ratio between the sub-matrices and the divided matrices corresponding to the sub-matrices is a first ratio, a ratio between a number of the sub-matrices and a number of the parallel processors is a second ratio, and a ratio between the first ratio and the second ratio is an integer.

15. The method according to claim 14, wherein the parallel processors perform the correction process with min-sum algorithms by comparing minimum values of the first correction result and the second correction result.

16. The method according to claim 14, wherein the number of the sub-matrices is 360, the number of the parallel processors is 180, and the parallel processors perform the correction process according to the y-axis indices corresponding to the divided matrices.

17. The method according to claim 14, wherein the number of the sub-matrices is 360, the number of the parallel processors is 120, and the parallel processors perform the correction process according to the x-axis indices corresponding to the divided matrices.

18. The method according to claim 14, further comprising:
    converting the sub-matrices to unit matrices by address shifting according to the first correction result and the second correction result.

19. The method according to claim 11, wherein each of the sub-matrices is stored in one of a plurality of memory units respectively.

20. The method according to claim 11, wherein in the step of respectively readdressing the sub-matrices into the plurality of divided matrices, when the sub-matrices are respectively a M*M matrix and a ratio between a number of the divided matrices corresponding to the first address group and a number of the parallel processors is n, a length of the divided matrices is M/n, and the controller compares the axis index with the length of the divided matrices; when the axis index is smaller than M/n, the axis index is same as the corresponding addresses of the sub-matrices of the divided matrices, and the axis index is address to a first divided matrix; and when the axis index is greater than M/n and smaller than 2M/n, the axis index is addressed to a second divided matrix, and the x-axis index is reset as x-axis index minus M/n.

* * * * *